United States Patent
Heckman et al.

(10) Patent No.: US 11,259,402 B1
(45) Date of Patent: Feb. 22, 2022

(54) FABRICATION OF ELECTRICAL AND/OR OPTICAL CROSSOVER SIGNAL LINES THROUGH DIRECT WRITE DEPOSITION TECHNIQUES

(71) Applicant: Government of the United States, as represented by the Secretary of the Air Force, Wright-Patterson AFB, OH (US)

(72) Inventors: Emily M. Heckman, Dayton, OH (US); Jeffrey P. Massman, Centerville, OH (US); Roberto S. Aga, Beavercreek, OH (US); Fahima Ouchen, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 17/014,054

(22) Filed: Sep. 8, 2020

(51) Int. Cl.
*H05K 1/02* (2006.01)
*H05K 3/12* (2006.01)

(52) U.S. Cl.
CPC .............. *H05K 1/0228* (2013.01); *H05K 3/12* (2013.01)

(58) Field of Classification Search
CPC ... H05K 1/0289; H05K 3/4685; H05K 1/0288
See application file for complete search history.

(56) References Cited

U.S. PATENT DOCUMENTS

| 3,865,624 A | 2/1975 | Wilde |
| 6,028,494 A * | 2/2000 | May ..................... H01P 3/085 333/1 |
| 9,024,450 B2 | 5/2015 | Blatchford et al. |
| 9,349,703 B2 | 5/2016 | Chiu et al. |

(Continued)

FOREIGN PATENT DOCUMENTS

| WO | 03098696 | 11/2003 |
| WO | 2017103797 | 6/2017 |

OTHER PUBLICATIONS

Hunrath, C., Circuit Technology Crossovers Where PCBs and Printed Electronics Meet, http://www.circuitinsight.com/pdf/circuit_technology_crossovers_ipc.pdf.
(Continued)

*Primary Examiner* — Jeremy C Norris
(74) *Attorney, Agent, or Firm* — AFMCLO/JAZ; Timothy Barlow

(57) ABSTRACT

A printed circuit board (PCB) comprises two or more PCB layers comprising of a dielectric core and conductive cladding on adjoining surfaces; one or more DC lines embedded in one or more layers of the two or more PCB layers; one or more RF signal lines embedded in one or more layers of the two or more PCB layers; wherein the one or more DC lines crosses over/under at least one of the RF signal lines to form at least one crossover, wherein the at least one crossover is no thicker than the PCB layer in which it is situated. The printed circuit board of claim 1, further comprising two or more generally parallel DC lines which converge to form a
(Continued)

stack of superposed parallel DC lines where the two or more DC lines cross over the one or more RF signal lines.

5 Claims, 14 Drawing Sheets
(11 of 14 Drawing Sheet(s) Filed in Color)

(56) References Cited

U.S. PATENT DOCUMENTS

2009/0020829 A1    1/2009   Chandra

OTHER PUBLICATIONS

Rasheed, F. et al., Crossover-aware Placement and Routing for Inkjet Printed Circuits, ACM Journal on Emerging Technologies in Computing Systems, vol. 16, No. 2, Article 19. Pub. date: Jan. 2020. https://www.autodesk.com/products/eagle/blog/additive-pcb-manufacturing-desktop/.
Biswas, S., Integrated multilayer stretchable printed circuit boards paving the way for deformable active matrix, Nature Communications, 2019, 10:4909, https://doi.org/10.1038/s41467-019-12870-7, www.nature.com/naturecommunications.

\* cited by examiner

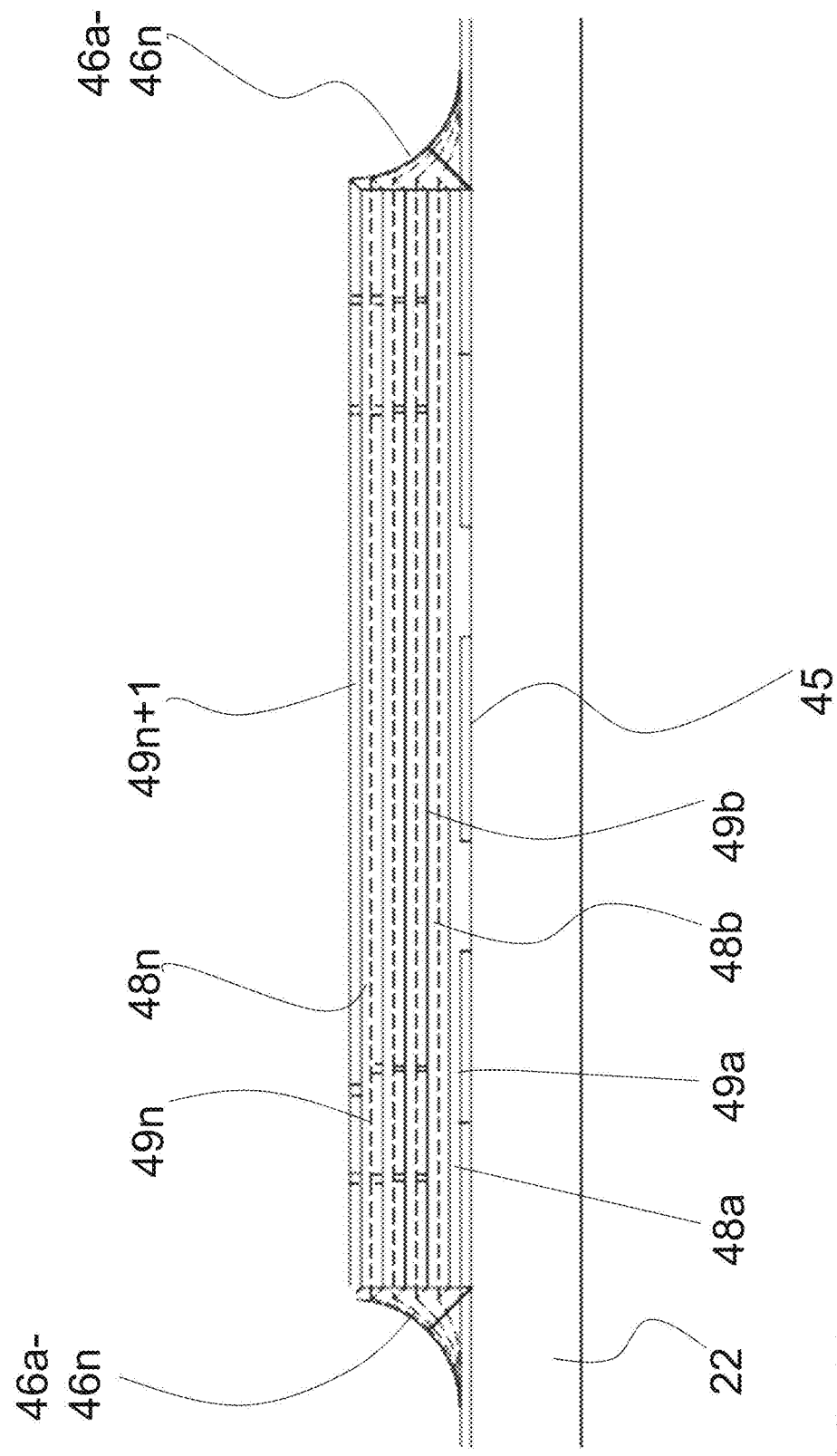

FABRICATION OF ELECTRICAL AND/OR OPTICAL CROSSOVER SIGNAL LINES THROUGH DIRECT WRITE DEPOSITION TECHNIQUES

RIGHTS OF THE GOVERNMENT

The invention described herein may be manufactured and used by or for the Government of the United States for all governmental purposes without the payment of any royalty.

FIELD OF THE INVENTION

The present invention relates generally to the fabrication of printed circuits and, more particularly, to the fabrication of crossovers for printed circuits using additive manufacturing techniques.

BACKGROUND OF THE INVENTION

Signal crossovers have been implemented in printed circuit boards (PCBs) for as long as PCBs have existed. The conventional way to fabricate signal crossovers calls for the design of separate signal lines in separate laminate layers with signal lines interconnecting through arrays of plated vias. Plated vias add complexity in the design and fabrication of the PCBs, as well as bulkiness of the final products due to the additional laminate layers needed. Surface mount crossover COTS (commercial off the shelf) chips are currently being offered as alternatives to embedded layer crossovers. The main challenge in these COTS signal crossover chips is that each crossover chip has very limited performance characteristics because each is designed for a very specific application. Accordingly, it is difficult to find a COTS component that is suitable for every application. In addition, there are only a handful companies that manufacture and sell COTS crossover SMTs (surface mount technology). The COTS versions available are very limited in applications, i.e. AVX up to 6 GHz, and TFC up to 20 GHz, and they are very costly (~$10-$15/piece, wholesale). A further problem is that they include very bulky packaging, limiting multiple SMT density, i.e. how many are able to be integrated per unit area while mitigating undesired cross-talk issues.

In addition, the MIMIC COTS crossovers have serious deficiencies in term of customizable power ratings, power efficiencies, and desired frequency ranges-major impact on cost and availabilities. MIMIC stands for Microwave/Millimeter-wave Monolithic Integrated Circuits; This is the technology used to generate the COTS crossover.

Further, lithographically-patterned crossovers can be extremely complex to design and implement: multiple crossovers in a 3D configuration require multiple masking and processing steps that need to be fine-tuned to the existing fabrication capabilities and limitations, which can be hindered by the lack of the desired resolution, as well as by material availability. Lithographically-fabricated 3D crossovers are also mostly restricted to perpendicular signal line crossings to accommodate existing design and fabrication tools.

Some prior art arrangements call for RF signals to cross over RF, RF to cross over DC, or DC to cross over DC, and even optical signals may cross over electrical signals. As a consequence of those signal crossovers, PCBs may have a significant number of layers, leading to bulky, heavy, complex, and costly circuits. The design and fabrication involving the traditional signal crossing arrangements require highly skilled engineering and specialized foundries thus adding an undesired cost/performance value to the end product.

What is desired are novel design and fabrication concepts for implementing signal crossovers that avoid these problems and limitations. The design gaps may be filled by a clever pinpointed multilevel crossover architecture design and the use of direct write process described below where materials can be directly, selectively, and precisely deposited in a wide range of configurations, while avoiding many of the problems inherent in the prior art.

SUMMARY OF THE INVENTION

The present invention overcomes the foregoing problems and other shortcomings, drawbacks, and challenges of fabricating signal crossovers for PCBs. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention a printed circuit board (PCB) comprises two or more PCB layers comprising of a dielectric core and conductive cladding on adjoining surfaces; one or more DC lines embedded in one or more layers of the two or more PCB layers; one or more RF signal lines embedded in one or more layers of the two or more PCB layers; wherein the one or more DC lines crosses over/under at least one of the RF signal lines to form at least one crossover, wherein the at least one crossover is no thicker than the PCB layer in which it is situated.

According to a first variation of the invention, the printed circuit board further comprises two or more generally parallel DC lines which converge to form a stack of superposed parallel DC lines where the two or more DC lines cross over the one or more RF signal lines.

According to another variation of the invention, the one or more DC lines cross over the one or more RF signal lines with an angle between greater than 0 degrees to 90 degrees.

According to a further variation of the invention, the printed circuit board further comprises two or more generally parallel RF lines which converge to form a stack of superposed parallel RF lines where the two or more RF lines cross over the one or more DC signal lines.

According to another variation of the invention, the one or more RF lines cross over the one or more DC signal lines with an angle between greater than 0 degrees to 90 degrees.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention. The patent or application file contains at least one drawing executed in color. Copies of this patent or patent application publication

FIG. 14 presents a side view of an additively-manufactured crossover arrangement, according to an embodiment of the present invention.

Figure 1:
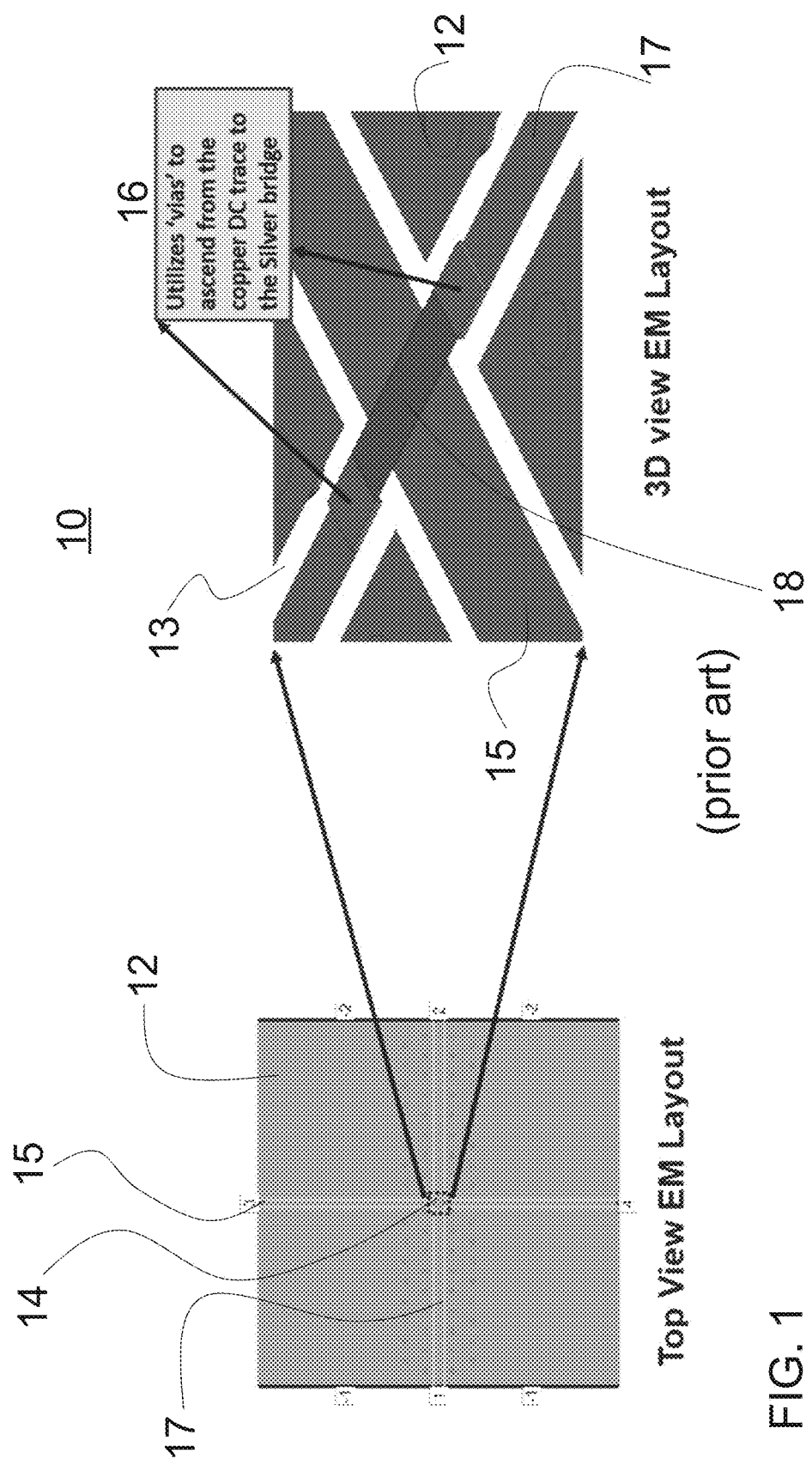
FIG. 1 illustrates a prior art crossover arrangement.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The use of direct write additive manufacturing technologies (such as aerosol jet, inkjet, or extrusion printing) may be used to precisely and accurately deposit a bridge and crossover signal carrying electrical and/or optical lines over other signal-carrying lines with no or minimal interference. The disclosed process fabricates such bridges and crossovers on the surface of a printed circuit board (PCB), and eliminates the need for extra laminate layers and bondply layers in the PCB stack up. This additive approach results in a significant improvement on the performance, cost, and reliability of electrical, optical, and hybrid circuit boards.

The direct write process offers the advantages of the wide range of versatile, customizable printing tools, materials, and concepts to fine tune the signal crossovers for optimum performance, lower cost, and ultralight and compact PCBs. This direct write approach enables performance at least similar to a COTS crossover chip but with the versatility to be adapted to all types of crossover signals, and it reduces the cost and complexity of fabrication compared to both the traditional PCB fabrication and the utilization of COTS crossover chips. With regard to tuning, there are several factors that need to be addressed. A robust design tool is recommended to allow for the prediction of the power performance of the printed materials in a planar configuration and, more importantly, in a crossover configuration, e.g. AWR from Microwave Office. The choice of the conductor materials and dielectric materials should be carefully approached to ensure not only that these materials fulfill the physical and chemical characteristics requirements, but that these materials are also compatible with the printing tools. A thorough testing of the materials is key to predicting their behavior in such a configuration.

Fine tuning the printing parameters have a direct impact on the printed material structural and morphological properties which will then impact the actual printed materials characteristics: impurities, defects, and volume voids in high density across the dielectric insulation may be detrimental to its performance as an insulation and isolation layer for the printed crossover.

The power performance, e.g. RF performance, of the printed conductor is very sensitive to the printed materials properties. Moreover, the printing of the conductor lines on top of a dielectric material may be challenging due to the properties of the dielectric material: surface tension and surface energies control not only the quality of the adhesion but also the nature of the interface. In the long run this interface will be the determining parameter for the reproducibility and reliability of these printed crossovers.

Direct-write printed crossovers are a very cost effective solution—multiple crossovers may be implemented per unit area at a high resolution in line widths and spacing (~50-100 µm), ensuring high operational fidelity.

The process for implementing additively-manufactured crossovers generally follows this flow:

Step 1: PCB substrate (junction board) preparation

Determine the design of the printed circuit board, including the specific locations of each of the DC and RF crossovers points.

Step 2: print the insulation/dielectric

Print an insulation/dielectric layer on a PCB substrate. The particular choice of material(s) for the insulation/dielectric layer should be determined by the desired electrical performance. This becomes critical at high frequencies.

Fine tune the post-print curing/sintering process to ensure that the properties of the insulation/dielectric layers are as close as possible to the bulk intrinsic properties and to ensure insulation/dielectric surface readiness for the next step. Curing processes are usually performed to get rid of residual solvents in the printed traces and to prepare for sintering. The process is tailored around the boiling temperature and the vapor pressure of the solvent, which may be affected by the environmental curing conditions, e.g. pressure, inert vs non-inert, etc.

Sintering involves more robust particle-particle interactions where the end goal is to lock the material in a close to bulk-like morphology. There are several ways to sinter a thin film and the most popular ones are thermal sintering and photonic sintering (Mostly UV sintering). Depending on the type of dielectric material used and the nature of the substrate used for PCB, we have to determine which process is the most suitable to achieve optimum material properties without compromising the other parts of the device. Here are some examples of post print processes:

NEA121 is a solvent-free epoxy-based material that is in liquid form at room temperature (RT) and doesn't "solidify" when thermally cured at T>RT. In order to "solidify" this material, the molecules need to be "crosslinked" and locked in that form. When exposed to moderate UV-power, the crosslinking occurs and solid films form. There is no need for thermal curing; the UV-exposure performs the sintering.

PMMA is another precursor for polymer-based dielectric materials. In order to be able to make thin films out of PMMA powder, it has to be dissolved in an organic solvent. The post-print process is a mere thermal curing at temperatures above the solvent's boiling temperatures (usually around 80° C.) but below the glass transition temperature (usually around 120° C.). No per se sintering is therefore required. Depending on how critical the "quality" of the finished dielectric layer, the choice of the material will dictate the printing and the post-printing processes.

Step three: print the conductor

Very narrow deviation from the bulk properties (especially at high frequency). The properties of the printed thin film conductor materials have to be fine-tuned to be as close as possible to the bulk properties as well. Those bulk-like materials properties are our references for "ideal" material.

Example: If the printed films are thinner than the required skin depth for high frequency application, then electrical losses (at those frequencies) will hinder the performance of the corresponding signal lines, which defeats the purpose intended for this application. Very narrow deviation from the "ideal" properties is inevitable and consequently acceptable. We perform electrical measurements (DC and RF) on the printed conductors and exact their optimum performance relative to the bulk properties which help us assess, analyze and fine tune our printing and post-printing process to fit the intended application.

Ensure physical continuity of the conductor line to ensure no resistive gaps are introduced, e.g. due to the ramp at the junction board/crossover bridge. This is accomplished by modifying the printing conditions to conform to the surface "irregularities". Conformal printing ensures a physical continuation of the printed traces.

Power handling testing and ratings of the printed crossovers. The attached figures demonstrate a high DC power study that we performed and which demonstrated the ability to run more than the required minimum power for our application (~4 W) without affecting the RF response.

PCBs having multiple crossovers require additional design consideration for optimum performance. Lines width & spacing, i.e. vertical spacing between adjacent, superposed conductors pose unique challenges and must be factored into the overall design to ensure desired performance of the PCB.

A variety of conductor materials, e.g. silver and/or copper inks, and insulator materials, e.g. NEA121A, PMMA, EXP2560 (thermally cured), and any dielectric material that is compatible with direct write printing technology, may be implemented in a single PCB to synchronously perform efficiently in a designed signal crossover configuration.

There are several options for conductive materials (Cu, Ag, Au, etc.). Ag is one of the most used printed conductors, and several Ag ink precursors are commercially available. The choice depends on the end user tool and end application Among the acceptable Ag inks are Ag Nanoink from Novacentrix, and AgX40 from UTDot.

NEA121A is a UV curable material having insulating/dielectric properties. An efficient way to build high aspect ratio (as high as 4:1) structures with NEA121A is to implement a print/cure process. The NEA121A printing may be performed under ambient conditions. Once the desired film thickness is achieved, a post-print treatment including a high power UV exposure for about 3 minutes may be undertaken to ensure a full cure. Next, the Ag (silver) lines are printed on NEA121A material without any prior surface treatment of the NEA121A. Excellent adhesion has been observed. The performance of the printed Ag lines surpasses the COTS crossover in term of high power handlings and ratings.

The printed Ag lines are thermally cured, e.g. at 150° C. for 30 minutes to 3 hours to prevent any thermal degradation that might occur in the NEA121A and the printed circuit board material. These processing conditions preserve the materials' properties. The material properties of the thin printed layers, enable a low profile protection/packaging scheme to be designed and implemented, rendering the overall PCB much thinner and lighter than prior art schemes.

Additive manufacturing/direct write of crossover signal lines may be applied to printed circuit boards (PCBs) toward signal crossovers that are totally customizable.

As illustrated in FIG. 1, conventional approaches call for crossovers in a multilayer configuration where like signals are connected through a complex network of vias across the laminates. FIG. 1 illustrates a prior art PCB crossover arrangement 10 having a printed circuit board (PCB) 12 and a crossover 14 at the intersection of two signal lines 15, 17. The white areas 18 are the PCB dielectric materials. As is done in conventional PCBs, the crossover 14 includes a pair of vias 16 which penetrate through one or more layers of the PCB 12 to provide an electric/signal connection over or under an intersecting signal line, 15, 17 with a bridge 18. However, because the vias 16 must penetrate one or more PCB layers, and the crossover bridge 18 is widely (vertically) separated from the signal line over which it crosses, the prior art arrangements are very bulky. More recent new approaches have been explored which call for surface-mount crossover signals in which COTS crossovers are commercially available to serve that purpose. The biggest disadvantages to surface mount crossover COTS are the cost and the limited crossover performance (e.g. limited frequency range, high insertion losses, high isolation, etc.), in addition to being thick and bulky.

Figure 2:
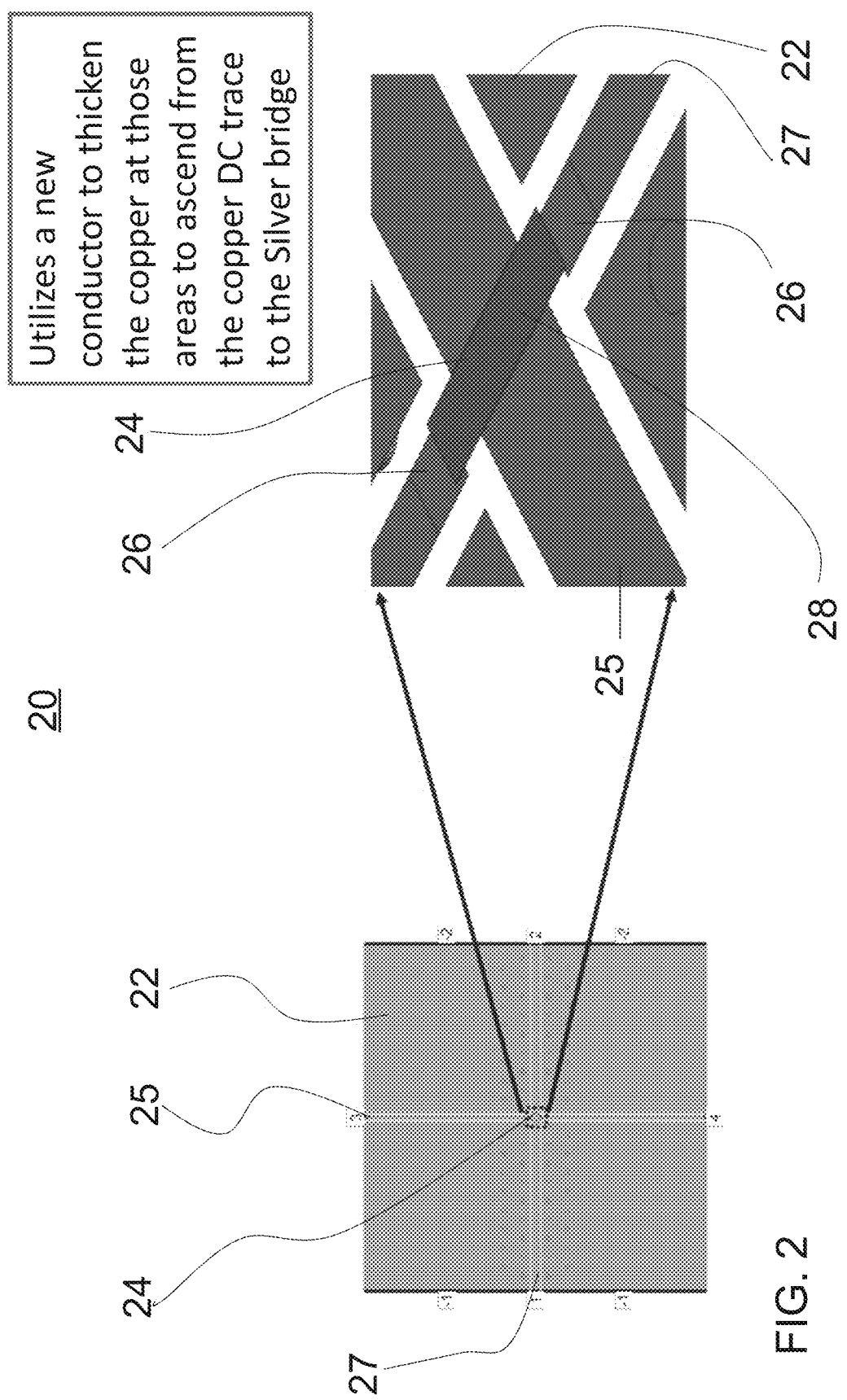
FIG. 2 illustrates an additively-manufactured crossover arrangement, according to an embodiment of the present invention.
Figure 3:
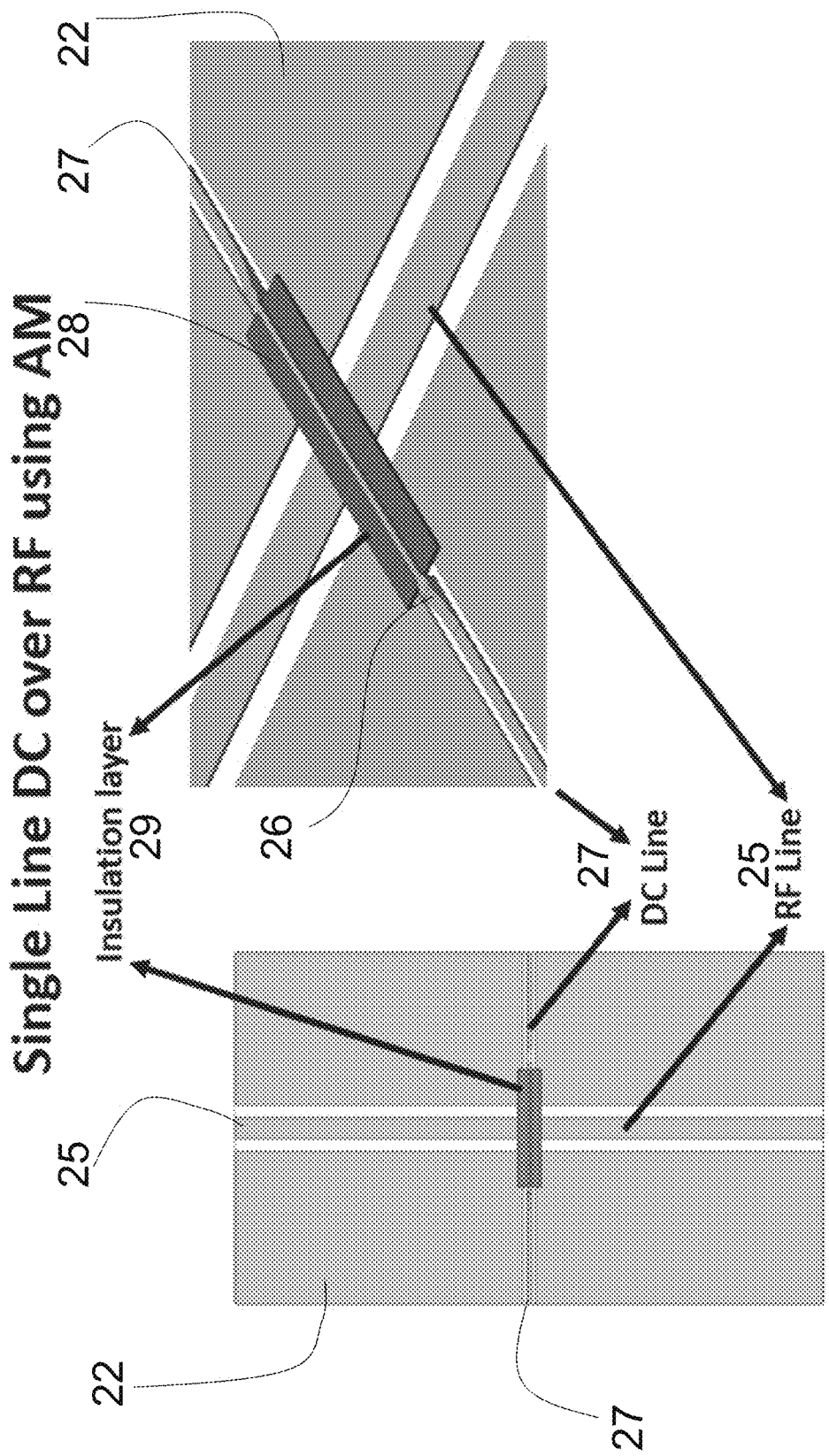
FIG. 3 illustrates an additively-manufactured crossover arrangement, according to an embodiment of the present invention.

A new approach is illustrated in FIGS. 2-3. A PCB 22 having a printed/additively-manufactured crossover arrangement 20 having a printed circuit board (PCB) 22 and a crossover 24 at the intersection of two signal lines 25, 27. Contrary to conventional PCBs 10, the printed crossover 24 includes a pair of printed ramps 26 which connect to an printed electric/signal connection (bridge 28) over or under an intersecting signal line, 25, 27. One ramp 26 is on each end of the bridge 18. Contrary to the prior art, the ramps 26 may be printed integrally with the bridge 28, and may be included in the same PCB layer as the signal line over which it crosses. As illustrated in FIG. 3, the bridge 28 is separated from the underlying signal line 25 by a printed insulation layer 29. This makes the inventive crossover arrangement 20 very thin and aids in reducing the dimensions of the PCB overall because the crossing signal lines 25, 27 may be included in the same PCB layer. A key solution to the inventive signal crossovers is the ability to tailor the signal crossings by controlling the coupling/decoupling of the signals crossing over/under each other. The COTS crossover approach offers no customization and the application is very much dependent on the specifications dictated by the manufacturer. In addition, COTS crossovers must be surface-mounted using a solder ball technology, adding another level of complexity to the circuit fabrication, and adding thickness and bulk to the final product.

The direct write approach, i.e. 3-D printing, additive manufacturing, offers a wide range of customizable processes to tailor the crossing of signals based on the desired performance and applications. Thicknesses and widths of the insulation layers may be tailored in each case to provide the desired crossover performance. Materials choices (dielectrics/insulators as well as conductors) are only limited by the printing (direct write) technologies. The additive approach to fabricating surface-deposited signal crossover alleviates the burden of complex multilayers, circuit design, fabrication, and testing.

Figure 4:
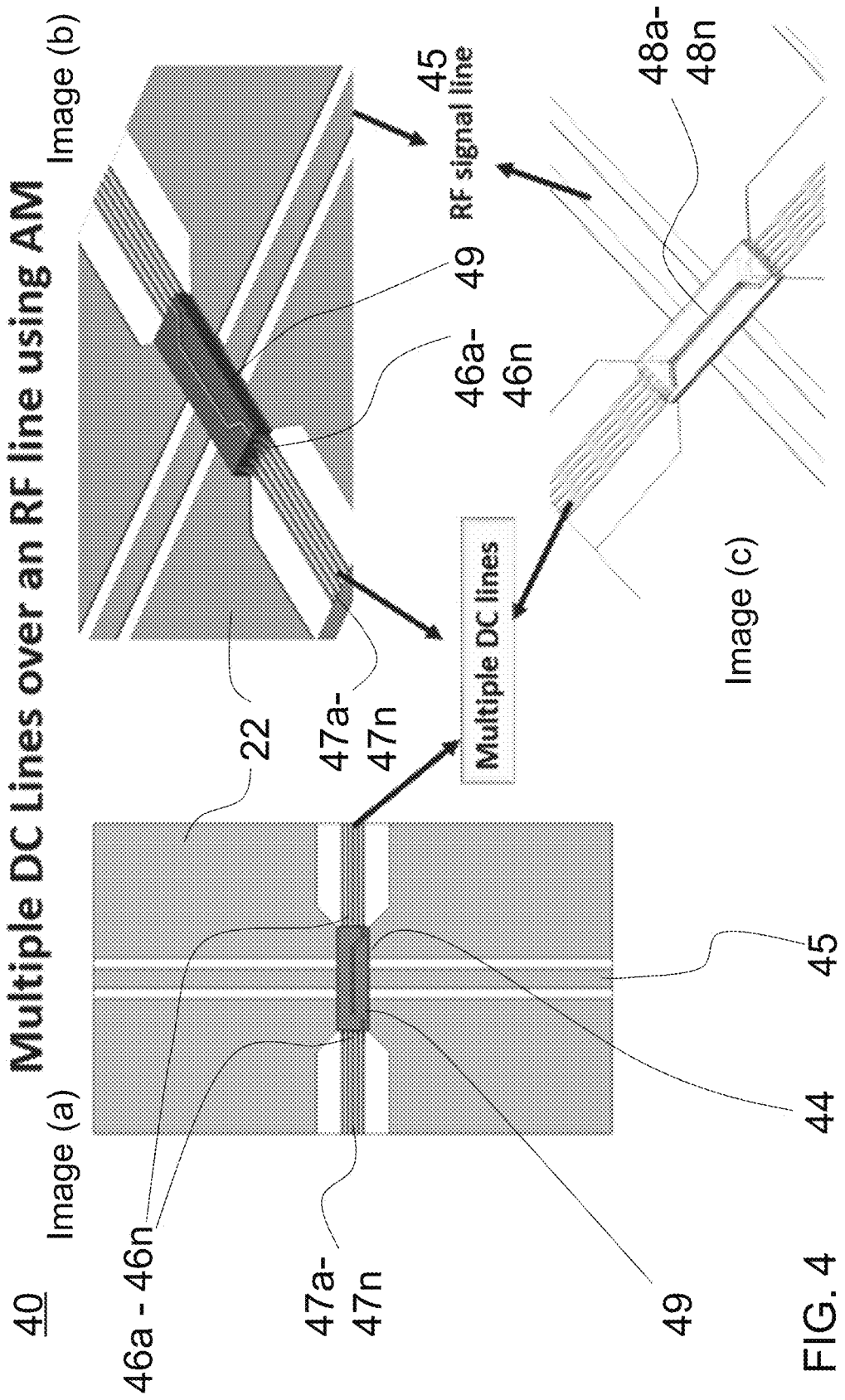
FIG. 4 illustrates an additively-manufactured crossover arrangement having multiple DC lines crossing over an RF signal line, according to an embodiment of the present invention.

FIG. 4 illustrates a variation of the embodiments presented in FIGS. 2-3. A PCB having a printed/additively-manufactured crossover arrangement 40 having a printed circuit board (PCB) 22 and a crossover 44 at the intersection of three or more signal lines 45, 47a-47n (a=1 and n is an integer greater than 1). Contrary to conventional PCBs 10, the printed crossover 44 includes a pair of printed ramps 46a-46n which connect to a printed electric/signal connection (bridge 48a-48n) over or under an intersecting signal line, 45, 47a-47n. Contrary to the prior art, the ramps 46a-46n may be printed integrally with the bridge 48a-48n, and may be included in the same PCB layer as the signal line 45 over which it crosses. A set of ramps 46a-46n is at each end of the stack of bridges 48a-48n. As illustrated in FIG. 4, the bridges 48a-48n are separated from the underlying signal line 45 by printed insulation layers 49, with at least one printed insulation layer 49 between the underlying signal line 45 and between each adjacent, superposed bridge 48a-48n. This makes the inventive crossover arrangement 40 very thin and aids in reducing the dimensions of the PCB overall because the crossing signal lines 45, 47-a-47n may be included in the same PCB layer. The multiple crossovers depicted (see FIGS. 4 and 14-15) are in a stacked configuration directly under/over each other. They don't necessarily need to be in this configuration; this is an option for a stacked version of the crossovers in a 2.5D to 3D configuration. In a variation of this invention, the crossovers may be arranged in the same layer next to each other, if you have enough area to integrate these crossovers. A more powerful and space saving approach, depicted in FIGS. 4 and 14-15, is a stackable version. In another variation of the invention, the crossovers may cross each other at an angle between 0° (parallel) and 90° (fully perpendicular).

The disclosed invention teaches the printing of signal lines on top of other signal lines, and which are spaced apart in a multilayer stack having desired electrical, dielectric, and insulating properties, hence signal crossovers. The electrical signals may be RF over RF, RF over DC, DC over RF, or DC over DC. The invention may include optical over electrical, or electrical over optical, when needed.

Additive manufacturing techniques, such as a direct write printing process, is used to selectively and precisely deposit a dielectric layer or a stack of dielectrics to act as isolators/insulators at the crossover area. A conductive ink is then printed on each dielectric layer to form the crossover conductive bridge 48a-48n with precise thickness and cross sectional area. This process may be repeated if multi-signals over crossings are desired. Modeling and simulation programs may also be used to optimize the cross-over performance, and to fine tune the properties of the printed traces.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 5:
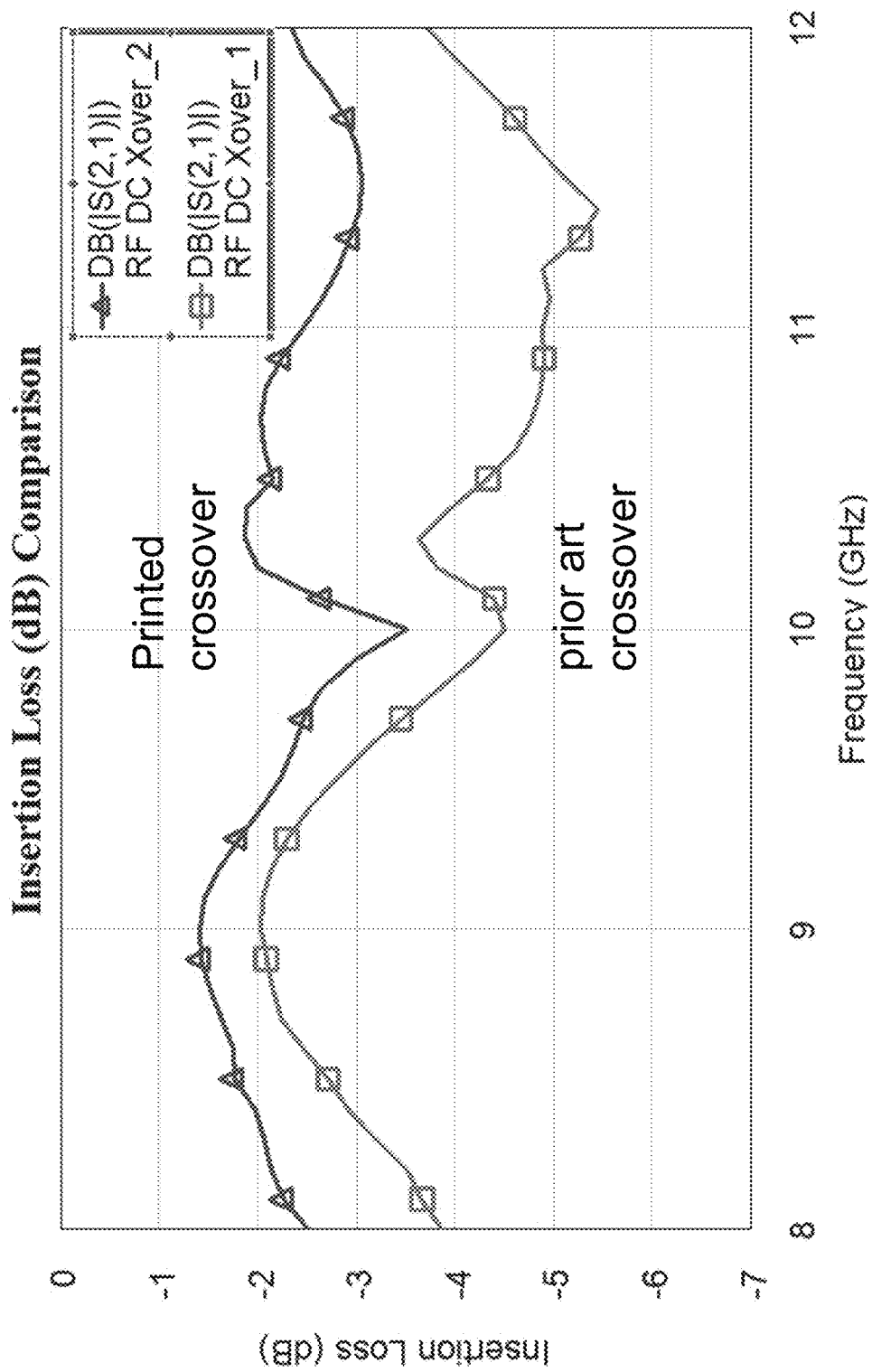
FIG. 5 illustrates an insertion loss comparison, without DC bias, of a prior art crossover and an additively-manufactured crossover in a microwave environment, according to an embodiment of the present invention.

FIG. 5 illustrates microwave simulation results for a comparison of the insertion losses for prior art crossovers and the new arrangement, without DC bias. The bottom line, represented with squares, presents the performance of the prior art crossovers. The upper line, represented with triangles, presents the performance of the new, printed crossovers. As shown, the new, printed crossovers have measurably lower insertion losses.

Figure 6:
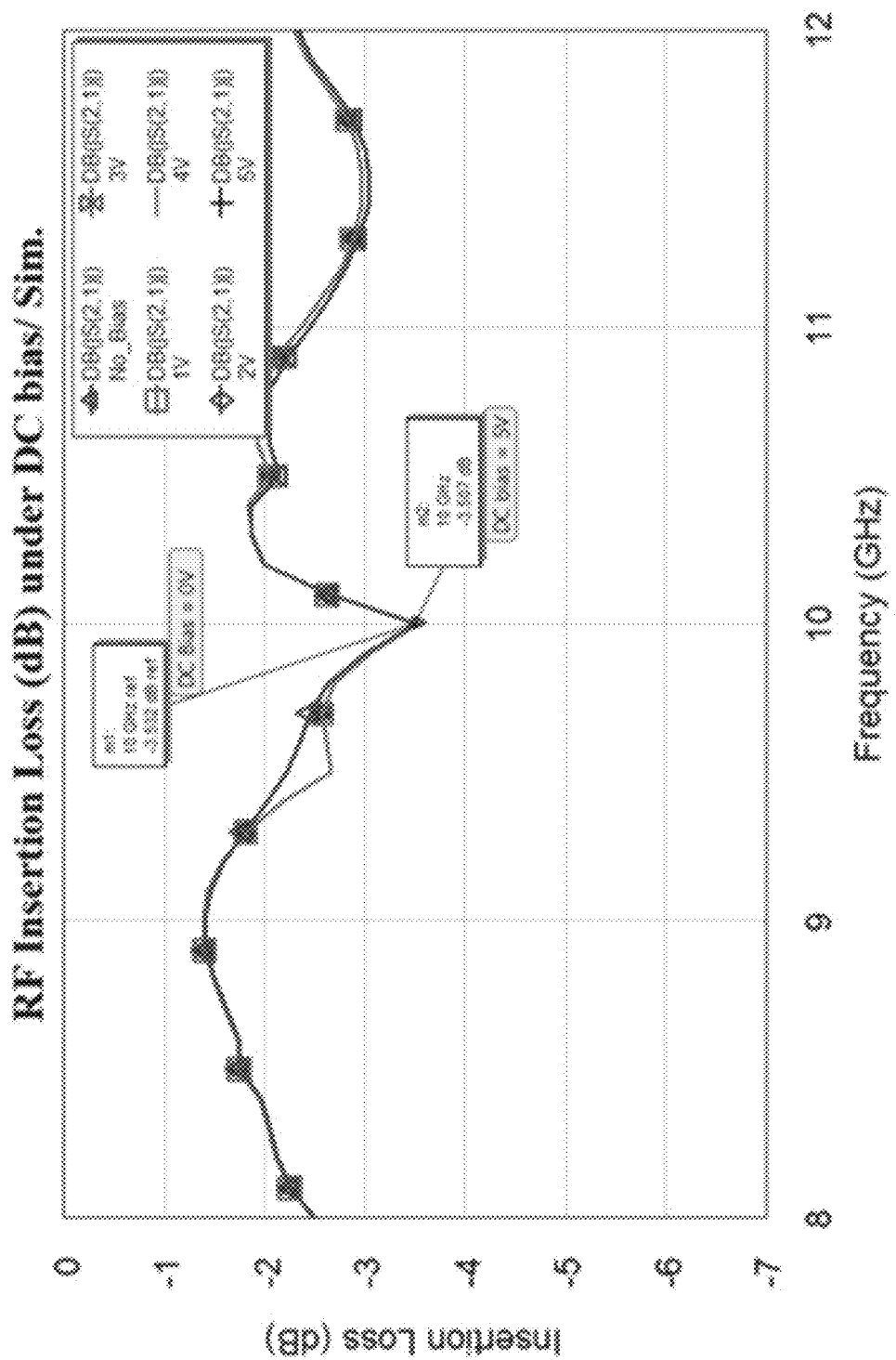
FIG. 6 illustrates insertion losses under DC bias across a range of frequencies, according to an embodiment of the present invention.

FIG. 6 presents microwave simulation results for DC bias added to the printed crossover arrangements described above at six voltage levels, i.e. 0 volts, 1 volt, 2 volts, 3 volts, 4 volts, and 5 volts. The printed crossovers demonstrate remarkable consistency across the range.

Figure 7:
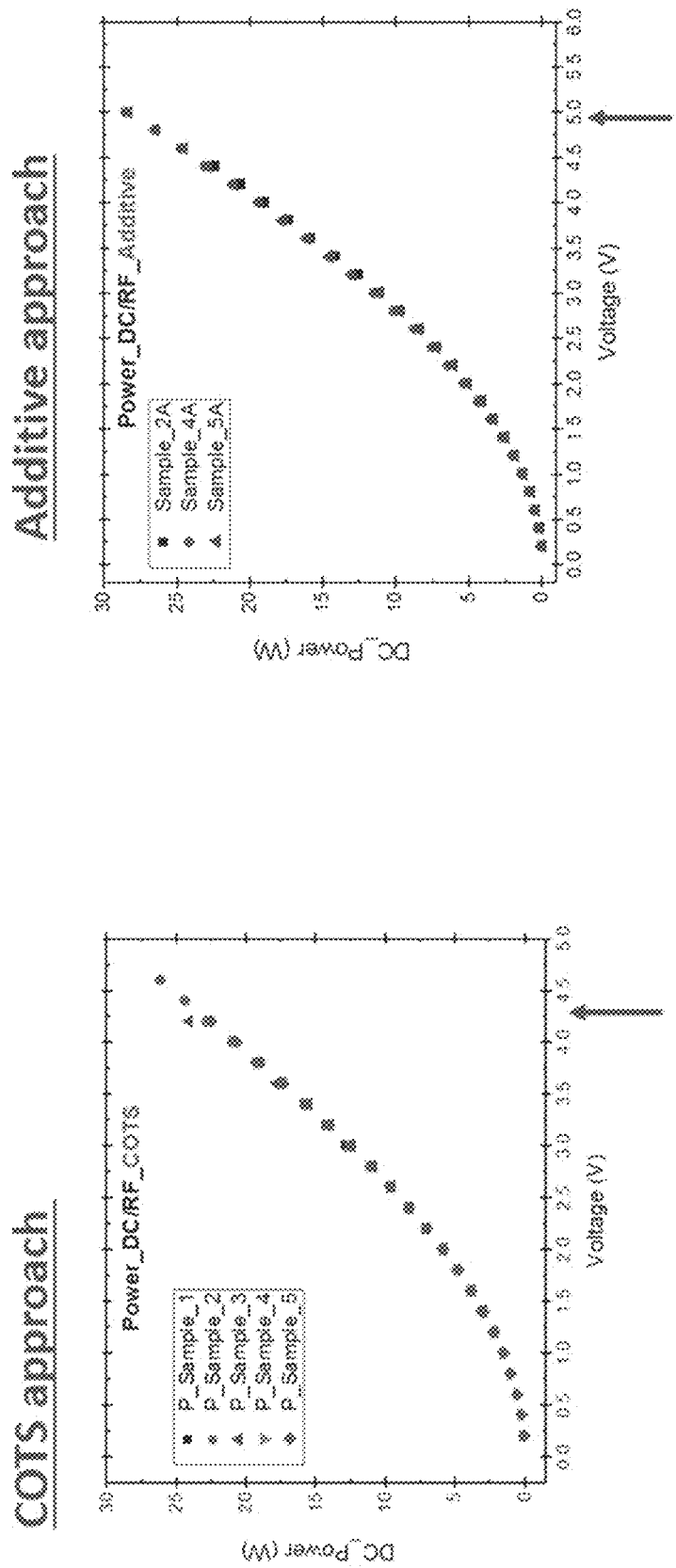
FIG. 7 illustrates a comparison of COTS and additive crossover performance, according to an embodiment of the present invention.

FIG. 7 compares the COTS approach to the additive/printed crossovers over a wide range of voltages and increasing DC power levels. It should be noted that the printed crossovers demonstrate a significant performance advantage; the COTS PCBs overheated at about 4.3 volts, while the PCBs with printed crossovers did not overheat until almost 5.0 volts.

Figure 8:
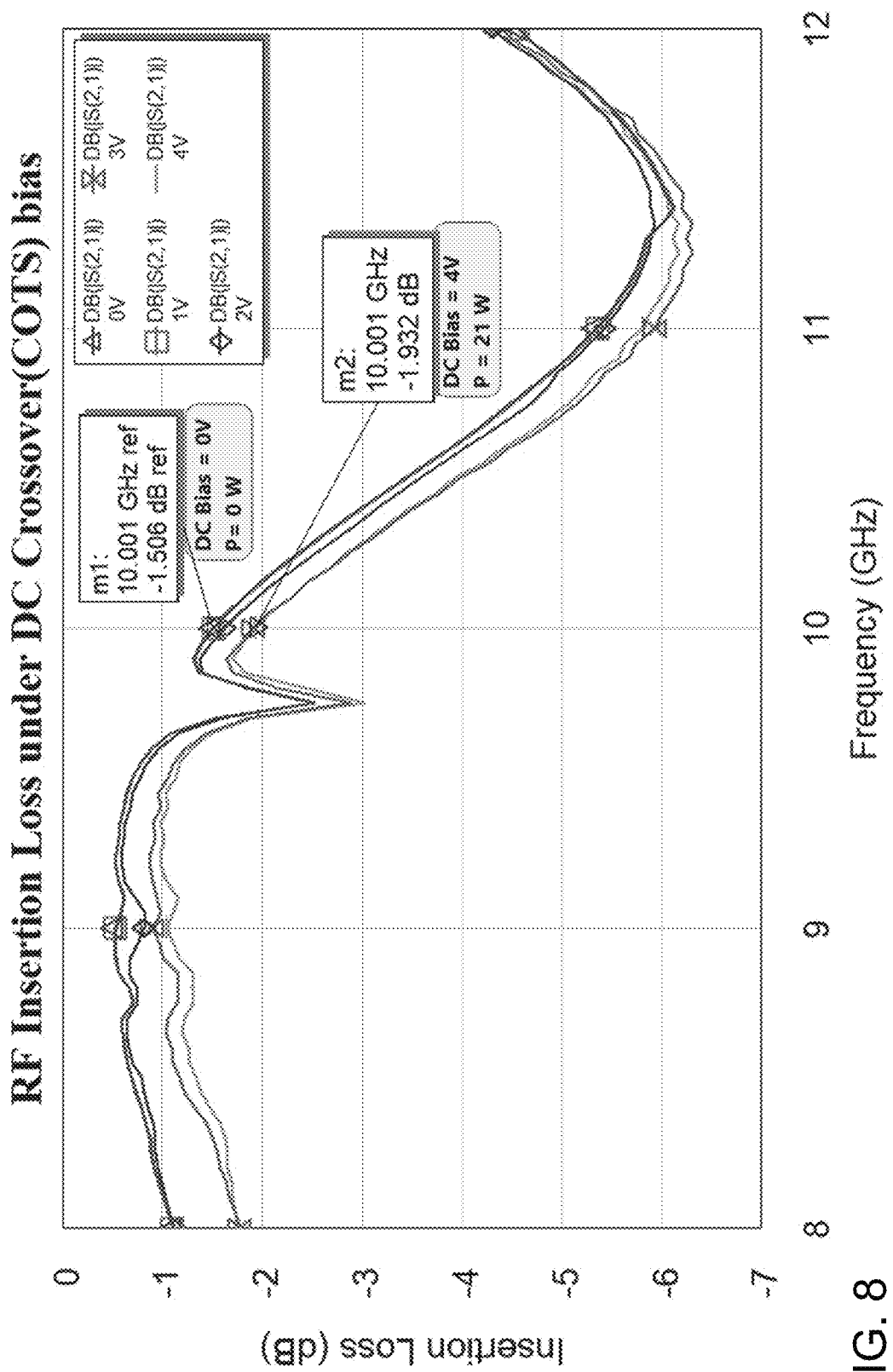
FIG. 8 illustrates RF insertion losses under a DC crossover bias with a COTS crossover.
Figure 9:
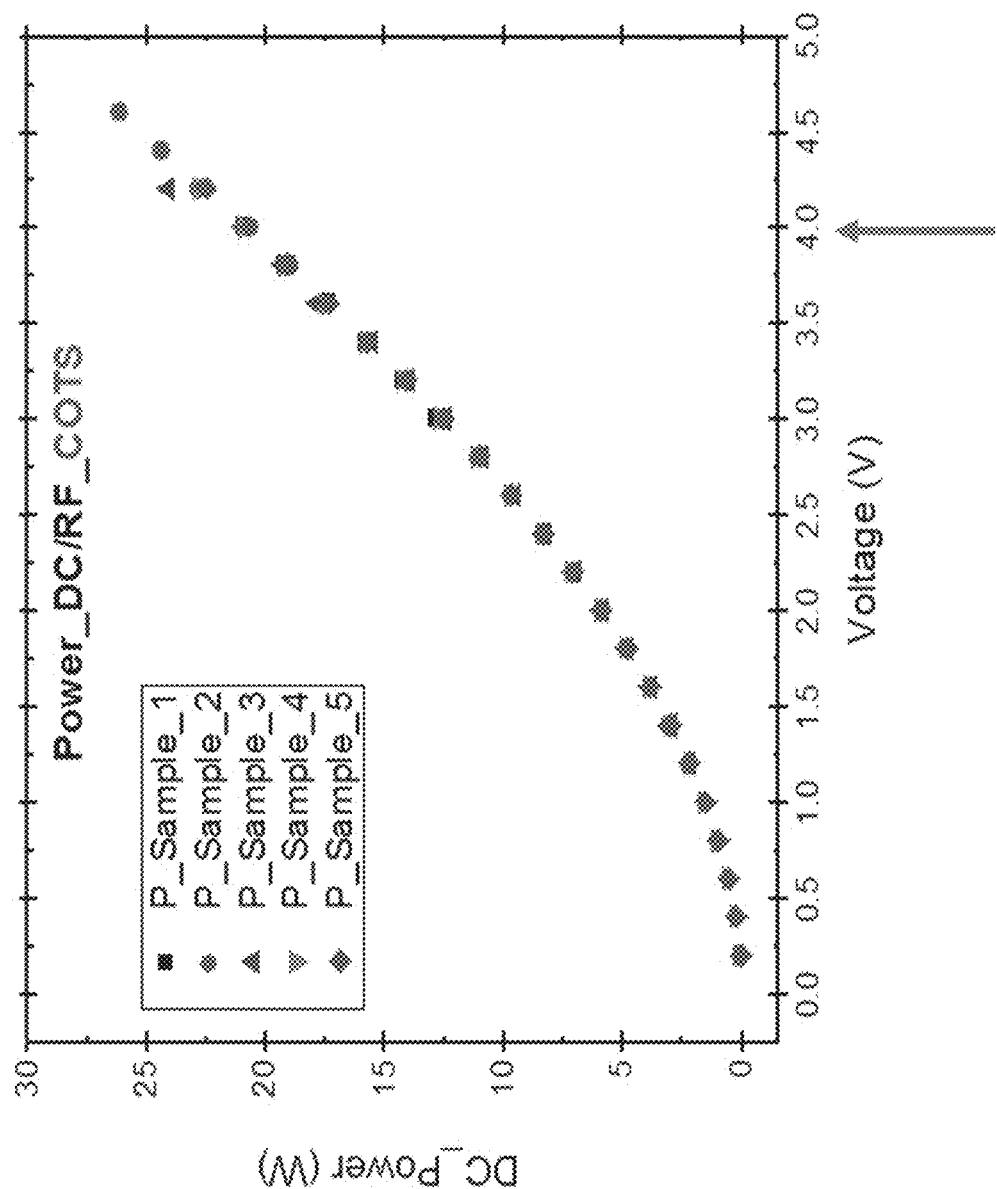
FIG. 9 illustrates COTS crossover performance with applied DC power.

FIGS. 8-9 present RF insertion losses for a PCB having a COTS crossover under DC bias, between 8-12 GHz. As presented in FIG. 9, the COTS PCBs overheated at about 4.0 volts and about 19 Watts.

Figure 10:
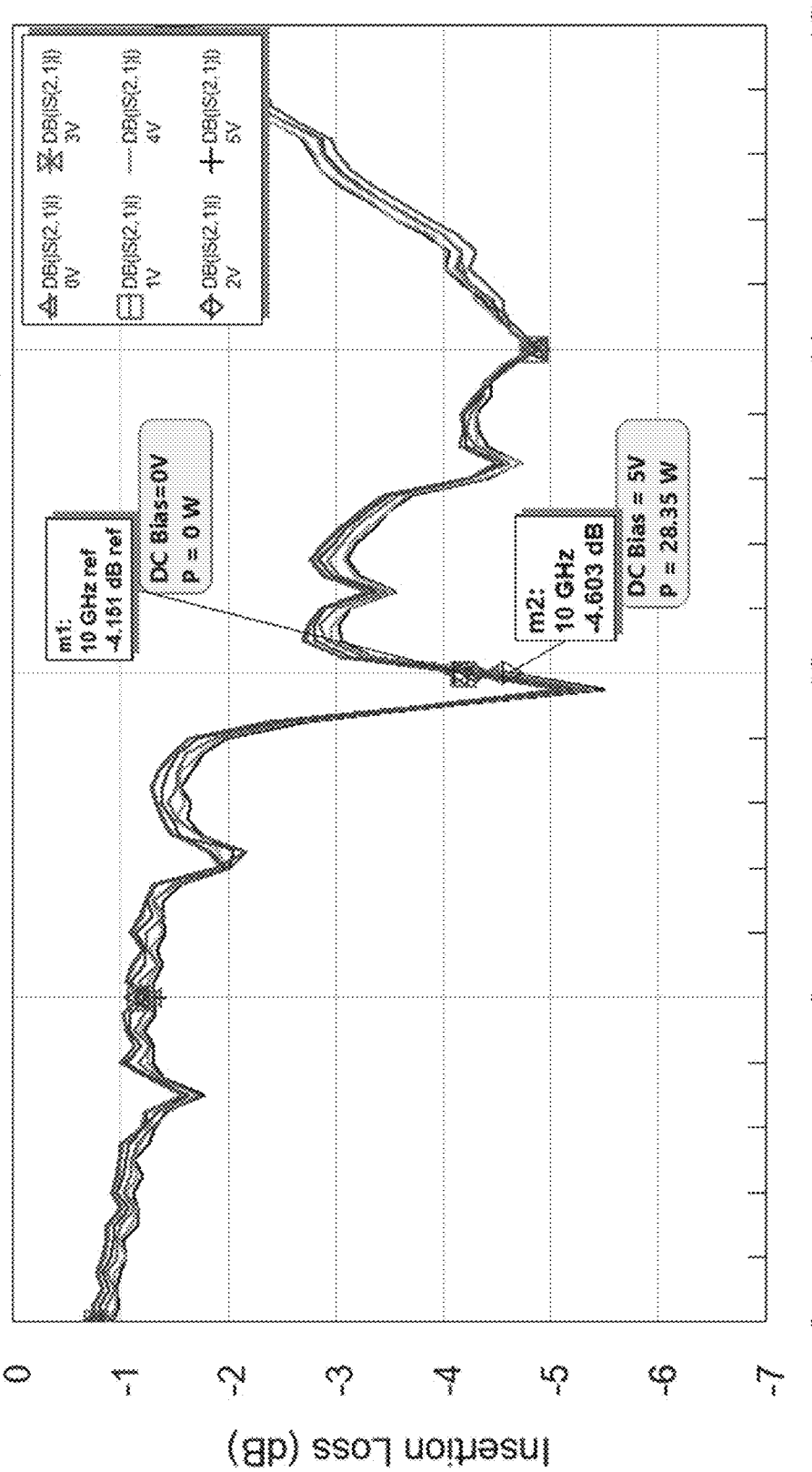
FIG. 10 illustrates RF insertion losses under a DC crossover bias with an additively-manufactured crossover, according to an embodiment of the present invention.
Figure 11:
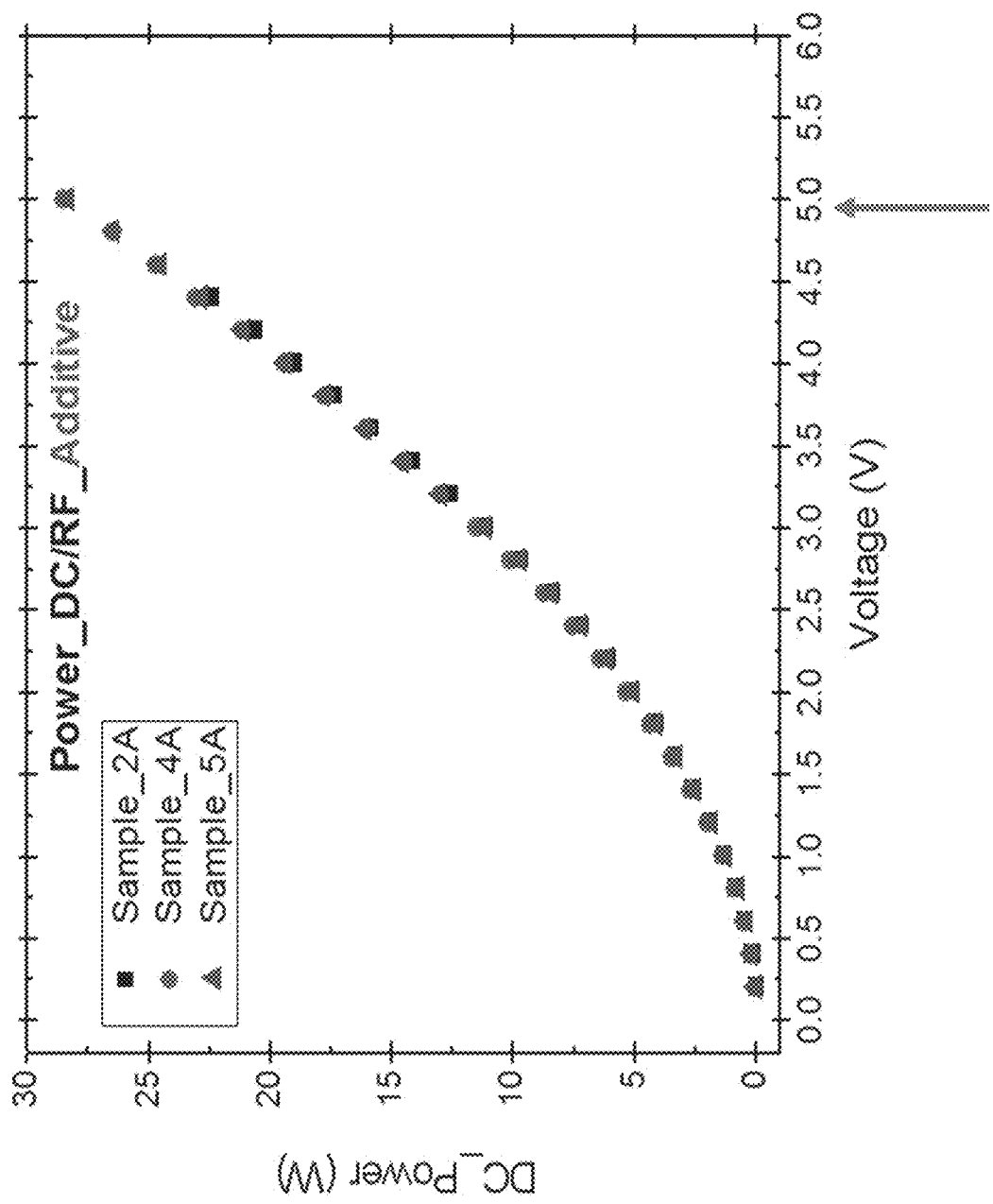
FIG. 11 illustrates the performance of an additively-manufactured crossover with applied DC power, according to an embodiment of the present invention.

FIG. 10-11 present RF insertion losses for a PCB having a printed crossover under DC bias, between 8-12 GHz. As presented in FIG. 11, the PCBs with the printed crossovers overheated at about 4.9 volts and over 25 Watts, which is a remarkable improvement over the performance of the prior art COTS crossovers.

Figure 12:
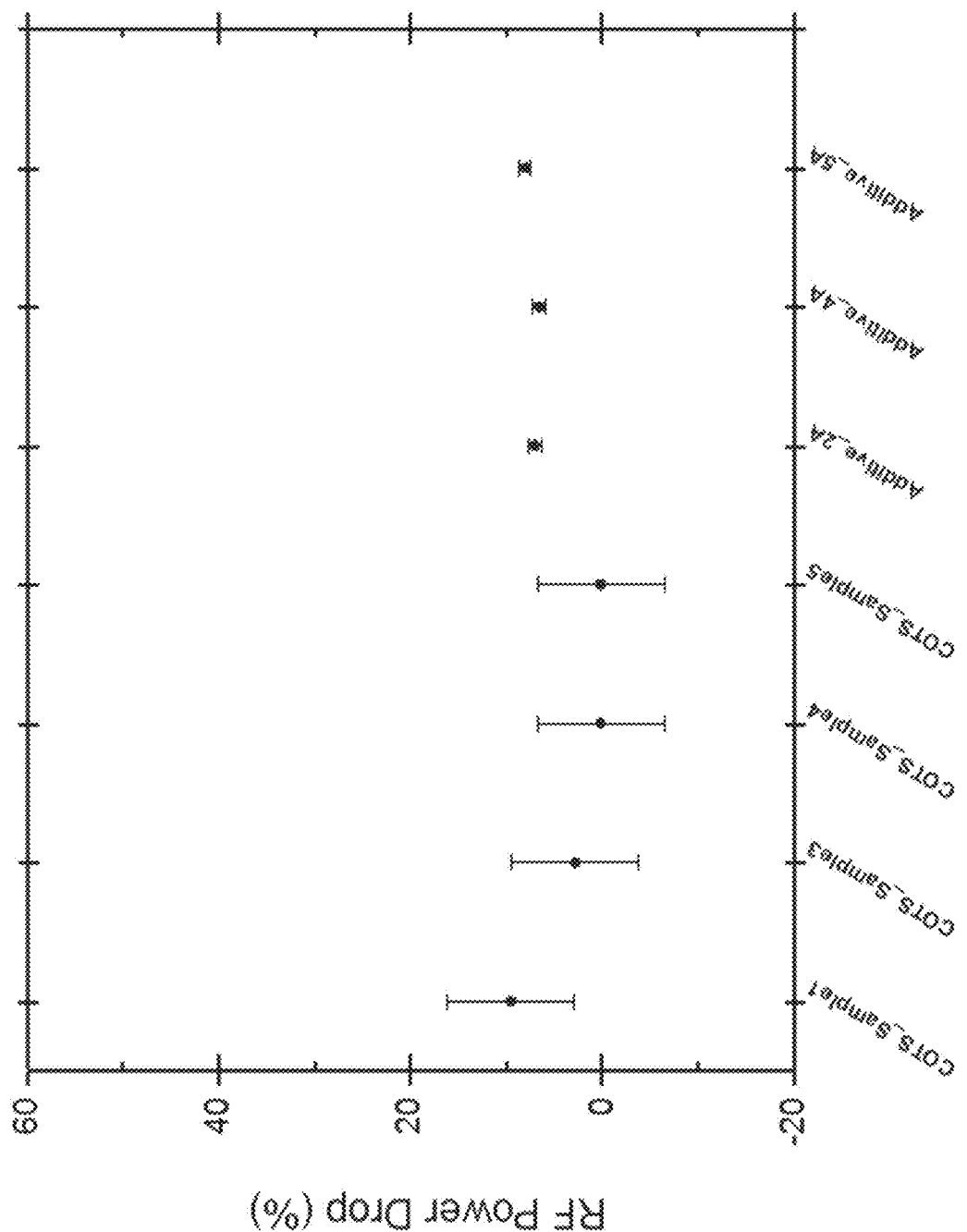
FIG. 12 illustrates the effect of high DC power on RF response, comparing COTS and additively-manufactured crossovers, according to an embodiment of the present invention.

FIG. 12 compares the effect of high DC power on RF response for both COTS crossovers and printed crossovers. FIG. 12 illustrates the calculated relative RF power drops for each type. The four COTS crossovers on the left side of FIG. 12 displayed a wide range of power drops, while the three printed crossovers on the right of FIG. 12 are extremely uniform in their performance. The additive/printed samples displayed tighter distribution across the samples, with a slightly higher RF power drop for an additive DC over an RF Crossover. On the other hand, the COTS crossovers displayed a wider distribution of the relative power drop across COTS samples. The COTS crossovers also displayed issues with the solder contact at high power, and the COTS PCB overheated.

Figure 13:
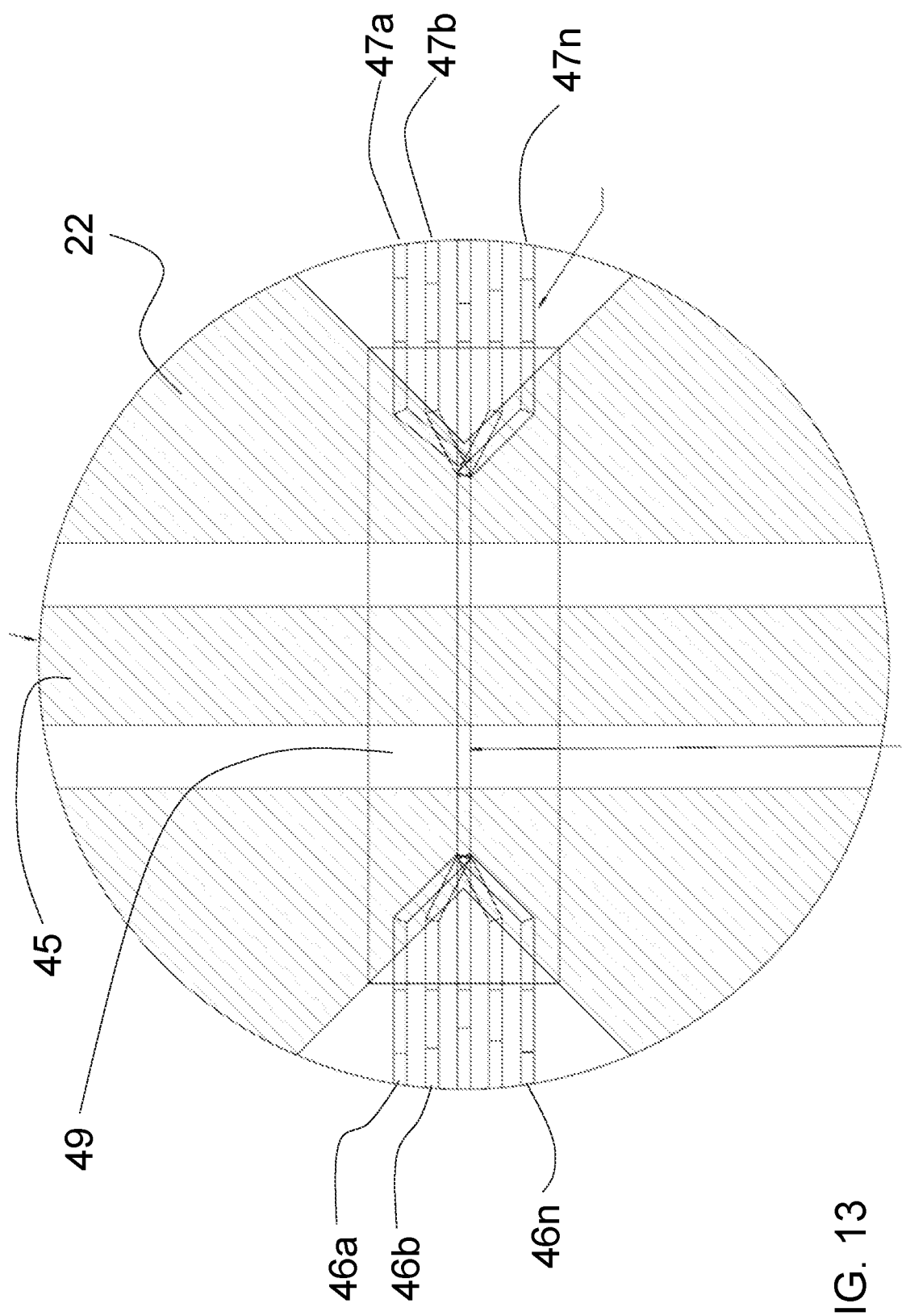
FIG. 13 presents an elevated view of an additively-manufactured crossover arrangement, according to an embodiment of the present invention.

FIG. 13-14 illustrate top and side views of a printed/additive crossover, according to an embodiment of the invention. The embodiment illustrated in FIGS. 13-14 correspond to FIG. 4, described above, and the numbering/identification of the elements are the same. However, FIGS. 13-14, like Image (c) of FIG. 4, are presented in a manner so as to allow us to view through the insulation layers 49a-49n so that the superposed arrangement of the bridges 48a-48n can be seen.

According to an embodiment of the invention, a printed circuit board may be conventionally fabricated using copper clad laminates. The signal crossovers intercept on the surface are designed to be filled using additive processing to complete the crossovers. Based on the type of signals crossover, a variety of dielectrics may be printed selectively. There is no need for additional masking and etching processes. The insulator/isolator material may be any dielectric material that would fit the application in term of performance (insertion loss) and frequency range. Multiple dielectrics may be used and selectively deposited on the same PCB with no need for multiple masking and etchings.

Additive manufacturing concepts such as direct write printing processes may be used to selectively and precisely deposit a dielectric layer or a stack of dielectrics to act as isolator(s)/insulator(s) at the crossover area. A conductive ink, e.g. a silver ink, may be used to print the crossover conductive bridge with precise thickness and cross sectional area, e.g. 50-100 µm dielectric thickness, 3-6 µm silver ink thickness, and a sectional area of approximately 1 mm$^2$. This process may be repeated if multiple crossovers are desired. Modeling and simulation programs may also be used to optimize the cross-over performance to fine tune the properties of the printed traces.

Example

If we want to implement a PCB to process multiple signals in different frequency bands, e.g. X & K bands, on the same PCB, we may use printed crossovers to limit the thickness (and number of layers) of the PCB while maintaining the power and efficiency requirements. Different frequency bands will call for different design and fabrication resolutions to meet the impedance matching requirements.

RF and DC power handling capabilities may be hindered by, for example, a potential undesired capacitive coupling (between the signal lines) if the wrong dielectric material is used. Hence, the selection of the dielectric material is very critical for the design of the signal crossovers. Existing RF and DC models may be used to help determine the optimum electric/dielectric properties needed to achieve a good electrical insulation and low dielectric losses at high frequency.

Many materials will fit the BOM (bill of materials) requirements but only an extremely limited number will be compatible with the lithographic processes to define the crossover pattern.

The process of additively depositing materials via a direct write method on a selected area with a given resolution is compatible with a variety of substrates ranging from purely organic to purely inorganic and hybrids (what most PCBs are made of) as well. The limitation is driven by the ink rheology and the substrate surface properties, e.g. surface tension.

There are no limits in term of material choices as long as we ensure that each fits into the best of its category. The limitation in materials is dictated by whether they can be formulated in an ink form to render them compatible with the printing technology of choice. Dielectric materials should fit the major requirement of high electrical insulation (high electrical resistivity-bulk part values >$10^{10}$ Ohms-cm), very low dielectric losses and preferable high dielectric constant (if capacitive decoupling is required). Conductors should exhibit high DC conductivity (at least $1\times10^6$), good matching impedance for efficient signal transmission and good power handling capabilities. Thicknesses are dictated by the properties of the materials chosen.

A comparison of the COTS crossover approach to our novel approach yields compelling data.

With regard to COTS crossovers
Pros:
surface mount/flip chip soldering
Cons: (which are mostly related to the manufacturer's materials and fabrication technology)
Limited frequencies
Limited sizes for RF & DC signal
Limited Power handling options
Not customizable: RF & DC lines need to be designed around the specs of the Xover COTS.
In contrast, our novel additive approach offers significant advantages:
Pros:
Direct Write approach allows for printing on specific target locations
Wide range of choices of insulation (dielectric) materials
More flexibility for RF and DC lines design and fabrication
Cons:
Insulation material: choices limited (for now) by the printing technology While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A printed circuit board (PCB) comprising:
two or more PCB layers comprising a dielectric core and conductive cladding on adjoining surfaces;
one or more DC lines embedded in one or more layers of the two or more PCB layers;
one or more RF signal lines embedded in one or more layers of the two or more PCB layers;
wherein the one or more DC lines crosses over/under at least one of the RF signal lines to form at least one crossover, wherein the at least one crossover is no thicker than the PCB layer in which it is situated.

2. The printed circuit board of claim 1, further comprising two or more generally parallel DC lines which converge to form a vertically-arranged stack of superposed parallel DC lines where the two or more DC lines cross over the one or more RF signal lines, wherein the parallel DC lines diverge to either side of the RF signal lines.

3. The printed circuit board of claim 1, wherein the one or more DC lines cross over the one or more RF signal lines with an angle between greater than 0 degrees to 90 degrees.

4. The printed circuit board of claim 1, further comprising two or more generally parallel RF lines which converge to form a stack of superposed parallel RF lines where the two or more RF lines cross over the one or more DC signal lines.

5. The printed circuit board of claim 1, wherein the one or more RF lines cross over the one or more DC signal lines with an angle between greater than 0 degrees to 90 degrees.

* * * * *